United States Patent
Satou et al.

(10) Patent No.: US 7,271,639 B2
(45) Date of Patent: Sep. 18, 2007

(54) VOLTAGE LEVEL CONVERTER CIRCUIT AND SEMICONDUCTOR INTEGRATED CIRCUIT DEVICE

(75) Inventors: Youichi Satou, Kawasaki (JP); Hiroaki Suzuki, Yokosuka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 11 days.

(21) Appl. No.: 11/392,359

(22) Filed: Mar. 28, 2006

(65) Prior Publication Data
US 2006/0220682 A1  Oct. 5, 2006

(30) Foreign Application Priority Data
Mar. 29, 2005 (JP) .............................. 2005-095442

(51) Int. Cl.
*H03L 5/00* (2006.01)
(52) U.S. Cl. ........................ 327/333; 327/65; 326/80
(58) Field of Classification Search ................ 327/333, 327/315, 318, 319, 52, 55, 65; 326/62, 63, 326/80
See application file for complete search history.

(56) References Cited

U.S. PATENT DOCUMENTS

| | | | | |
|---|---|---|---|---|
| 5,619,150 A | * | 4/1997 | Briner | 327/55 |
| 6,002,290 A | * | 12/1999 | Avery et al. | 327/333 |
| 6,011,421 A | * | 1/2000 | Jung | 327/333 |
| 6,084,459 A | * | 7/2000 | Jeong | 327/333 |
| 6,670,841 B2 | * | 12/2003 | Kobayashi | 327/333 |
| 6,888,394 B2 | * | 5/2005 | Cleary et al. | 327/333 |
| 7,145,363 B2 | * | 12/2006 | Kim | 326/68 |

FOREIGN PATENT DOCUMENTS

JP  11-195975  7/1999

* cited by examiner

*Primary Examiner*—Kenneth B. Wells
*Assistant Examiner*—Hai L. Nguyen
(74) *Attorney, Agent, or Firm*—DLA Piper US LLP

(57) ABSTRACT

Differential signals are supplied to gates of first and second transistors. One end and a gate of a third transistor are connected to a signal output node. One end and a gate of a fourth transistor are connected to the other end of the second transistor. A fifth transistor is connected between a power source and the other end of the third transistor. A sixth transistor is connected between a power source and the other end of the fourth transistor. A seventh transistor is inserted between the power source and the signal output node. An eighth transistor is inserted between the power source and the common connection node of the second and fourth transistor, and a gate of the eighth transistor is connected to the gate of the sixth transistor.

13 Claims, 4 Drawing Sheets

VOLTAGE LEVEL CONVERTER CIRCUIT AND SEMICONDUCTOR INTEGRATED CIRCUIT DEVICE

CROSS-REFERENCE TO RELATED APPLICATIONS

This application is based upon and claims the benefit of priority from prior Japanese Patent Application No. 2005-095442, filed Mar. 29, 2005, the entire contents of which are incorporated herein by reference.

BACKGROUND OF THE INVENTION

1. Field of the Invention

The present invention relates to a voltage level converter circuit that is provided inside a semiconductor integrated circuit device which operates at a plurality of different power source voltages.

2. Description of the Related Art

Advances are being made in the lowering of the power source voltage in order to achieve low power consumption in semiconductor integrated circuit devices, and particularly in the CMOS type semiconductor integrated circuit device. For example, an external circuit which supplies signals to a semiconductor integrated circuit device which is driven by a low voltage such as 0.9V to 1.1V is driven by a 3.0V to 3.6V power source voltage for example. In the case where the value of the power source voltage for the semiconductor integrated circuit device is different from that of the external circuit which drives the semiconductor integrated circuit device, a voltage level converter circuit which converts voltage level is provided in the semiconductor integrated circuit device in order to achieve an interface with the external circuit.

The voltage level converter circuit described in FIG. 2B of Jpn. Pat. Appln. KOKAI Publication No. 11-195975 has been conventionally known as this type of voltage level converter circuit. The voltage level converter circuit described in the publication includes a pair of complementary circuits including a NMOS transistor and a PMOS transistor, and low voltage level signal is supplied to each gate terminal of the pair of NMOS transistors, and high level signal in which the voltage has been increased is output via one PMOS transistor.

In the above-described conventional circuit, when the switch is made from the state in which high level signal is output via the PMOS transistor, to that where the next NMOS transistor is in an ON state and low level signal is output in one complementary circuit, the time until the PMOS transistor and the NMOS transistor are simultaneously in the ON state is long and the transfer time of the output signal from high level to low level is also long.

In order to solve this problem, in the voltage level converter circuit shown in FIG. 3 of the above-described publication, the current brocking PMOS transistor is serially connected to each of the PMOS transistors in the pair of complementary circuits.

However, the voltage level converter circuit, when the low voltage level signal that is supplied to the gate terminal of the NMOS transistor is lowered, the ON resistance is reduced and thus the transition time when the output signal changes from high level to low level can not be improved by being decreased.

BRIEF SUMMARY OF THE INVENTION

According to one aspect of the present invention, there is provided a voltage level converter circuit including: a first transistor which has source and drain terminals and a gate terminal, one of the source and drain terminals being connected to a supply terminal having a first power source voltage, the other of the source and drain terminals being connected to a signal output node, and the gate terminal being supplied with one input signal of differential signals which perform level conversion; a second transistor which has source and drain terminals and a gate terminal, one of the source and drain terminals being connected to the supply terminal having the first power source voltage, and the gate terminal being supplied with the other input signal of the differential signals which perform level conversion; a third transistor which has source and drain terminals and a gate terminal, one of the source and drain terminals and the gate terminal being connected to the signal output node; a fourth transistor which has source and drain terminals and a gate terminal, one of the source and drain terminals and the gate terminal being connected to the other of the source and drain terminals of the second transistor; a fifth transistor which has source and drain terminals and a gate terminal, one of the source and drain terminals being connected to a supply terminal having a second power source voltage, the other of the source and drain terminals being connected to the other of the source and drain terminals of the third transistor, and the gate terminal being connected to the gate terminal of the fourth transistor; a sixth transistor which has source and drain terminals and a gate terminal, one of the source and drain terminals being connected to the supply terminal having the second power source voltage, the other of the source and drain terminals being connected to the other of the source and drain terminals of the fourth transistor, and the gate terminal being connected to the gate terminal of the third transistor; a seventh transistor which has source and drain terminals and a gate terminal, one of the source and drain terminals being connected to the supply terminal having the second power source voltage, the other of the source and drain terminals being bonded to the signal output node, and the gate terminal being connected to the gate terminal of the fifth transistor; an eighth transistor which has source and drain terminals and a gate terminal, one of the source and drain terminals being connected to the supply terminal having the second power source voltage, the other of the source and drain terminals being bonded with the other of the source and drain terminals of the second transistor, and the gate terminal being connected to the gate terminal of the sixth transistor.

DETAILED DESCRIPTION OF THE INVENTION

First Embodiment

Figure 1:
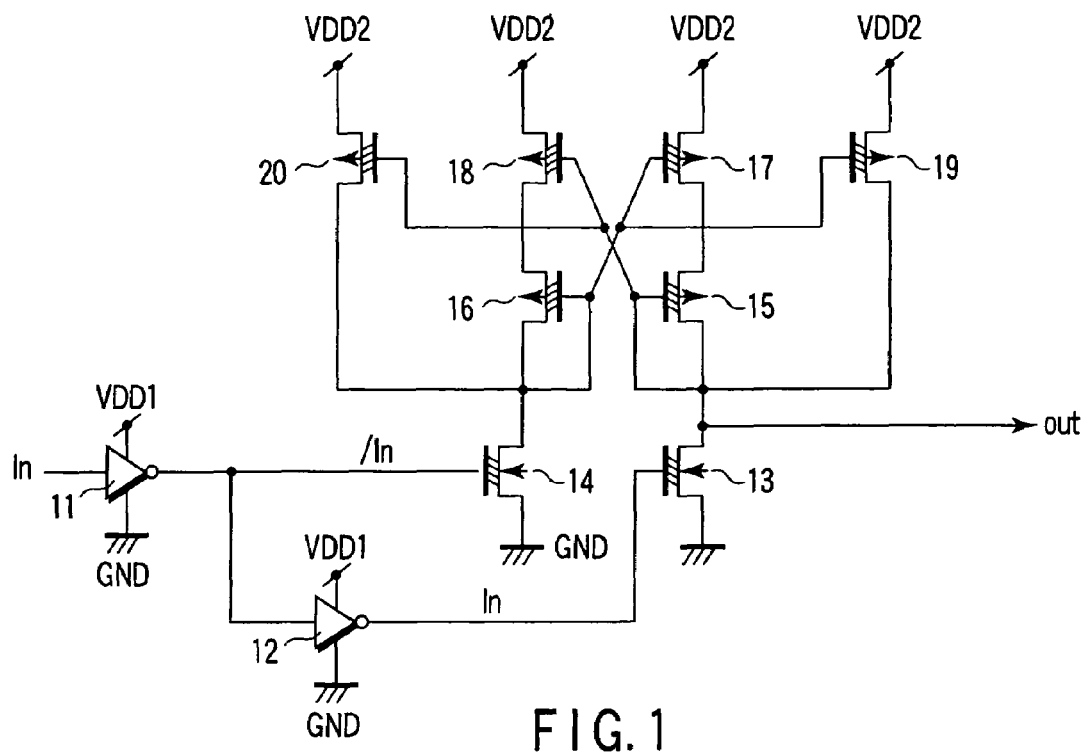
FIG. 1 is a circuit diagram of a voltage level converter circuit according to a first embodiment.

FIG. 1 shows a voltage level converter circuit according to a first embodiment. An input signal In which performs level conversion is supplied to a first inverter circuit 11 which operates at a first power source voltage VDD1. An output signal from the first inverter circuit 11 is supplied to a second inverter circuit 12 which operates at the same first power source voltage VDD1. That is, differential signals In, /In which have a first amplitude (GND to VDD1) are generated by the first and second inverter circuits 11 and 12. It is to be noted that the input signal In also has an amplitude between GND and VDD1.

One of source and drain terminals of an N-channel MOS transistor (hereinafter referred to as NMOS transistor) 13 is connected to a supply terminal having a ground voltage GND (0V). The other of the source and drain terminals of the MOS transistor 13 is connected to an output node of a signal Out. One signal In of the differential signals In, /In is supplied to a gate terminal of the NMOS transistor 13. One of source and drain terminals of an NMOS transistor 14 is connected to the supply terminal having the ground voltage GND. The other signal /In of the differential signals In, /In is supplied to a gate terminal of the NMOS transistor 14.

One of source and drain terminals, and a gate terminal of a P-channel MOS transistor (called PMOS transistor hereinafter) 15 are connected to the output node. Also, one of source and drain terminals, and a gate terminal of a PMOS transistor 16 are connected to the other of the source and drain terminals of the NMOS transistor 14.

One of source and drain terminals of a PMOS transistor 17 is connected to a supply terminal having a second power source voltage VDD2, and the other of the source and drain terminals is connected to the other of the source and drain terminals of the PMOS transistor 15. A gate terminal of the PMOS transistor 17 is connected to the gate terminal of the PMOS transistor 16.

One of source and drain terminals of a PMOS transistor 18 is connected to the supply terminal having the second power source voltage VDD2, and the other of the source and drain terminals is connected to the other of the source and drain terminals of the PMOS transistor 16. A gate terminal of the PMOS transistor 18 is connected to the gate terminal of the PMOS transistor 15.

One of source and drain terminals of a PMOS transistor 19 is connected to the supply terminal having the second power source voltage VDD2, and the other of the source and drain terminals is connected to the output node. A gate terminal of the PMOS transistor 19 is connected to the gate terminal of the PMOS transistor 17.

One of source and drain terminals of a PMOS transistor 20 is connected to the supply terminal having the second power source voltage VDD2, and the other of the source and drain terminals is connected to the other of the source and drain terminals of the NMOS transistor 14. A gate terminal of the PMOS transistor 20 is connected to the gate terminal of the PMOS transistor 18.

The mutual conductance (Gm) of the PMOS transistor 19 is smaller than that of the NMOS transistor 13, and the mutual conductance of the PMOS transistor 20 is smaller than that of the NMOS transistor 14. For example, the value of the first power source voltage VDD1 is 0.9V and the value of the second power source voltage VDD2 is 3.6V.

Next, the operation of the voltage level converter circuit having the above configuration will be described. First, when the input signal In is inverted from the high level (VDD1=0.9V) to the low level (GND), the output signal /In from the first inverter circuit 11 becomes the high level (VDD1=0.9V), and the output signal In from the second inverter circuit 12 becomes the low level. At this time, the NMOS transistor 13 is OFF and the NMOS transistor 14 is ON.

When the NMOS transistor 14 is ON, the other of the source and drain terminals of the NMOS transistor 14 is discharged to a ground potential, and the PMOS transistors 17 and 19 which have gate terminals connected at this terminal are also turned ON.

Meanwhile, because the signal Out from the output node has been at the low level (GND) prior to this, the PMOS transistor 15 is ON. Thus, the output node is rapidly charged to the high level (VDD2) by a path in which the two PMOS transistors 17 and 15 are serially linked, and a path of the PMOS transistor 19 only. If the difference in the level of VDD2 and the signal Out is smaller than a absolute value of a threshold voltage of the PMOS transistor 15 when the output node is being charged, the PMOS transistor 15 switches from the ON state to the OFF state and the output node is charged only by the PMOS transistor 19 which has a small mutual conductance. When the PMOS transistor 15 is in the OFF state, the signal Out is charged to a level that is sufficiently close to VDD2.

Next, when the input signal In is inverted from the low level (GND) to the high level (VDD1), the output signal /In from the first inverter circuit 11 becomes the low level (GND), and the output signal In from the second inverter circuit 12 becomes the high level (VDD1). At this time, the NMOS transistor 13 is ON and the NMOS transistor 14 is OFF. Because the NMOS transistor 13 becomes ON, the output node is discharged to the low level (GND) via the NMOS transistor 13. However, the PMOS transistor 19 has still been ON, and a penetration current flows between the supply terminal having the second power source voltage VDD2 and the supply terminal having the ground voltage (GND). At this time, the ON current of the PMOS transistor 19 is a hindrance when reducing the signal Out to the low level. However, the mutual conductance of the PMOS transistor 19 is small when compared with the mutual conductance of the NMOS transistor 13, and the current flowing to the PMOS transistor 19 is sufficiently small, and thus, the signal Out is rapidly reduced to ground level.

Meanwhile, when the signal Out is at the low level, the PMOS transistor 20 is turned ON and the signal from a common connection terminal for the PMOS transistor 16 and the NMOS transistor 14 is successively increased from the low level (GND) to the high level (VDD2). Then, when a difference between the VDD2 and the potential of the common connection terminal becomes smaller than the absolute value of the threshold value voltage of the PMOS transistor 16 or 17, the PMOS transistor 16 and 17 switch from the ON state to the OFF state. Furthermore, at the same time, the PMOS transistor 19 also switches to the OFF state, and charging to the output node from the supply terminal having the second power source voltage VDD2 is stopped.

Figure 2:
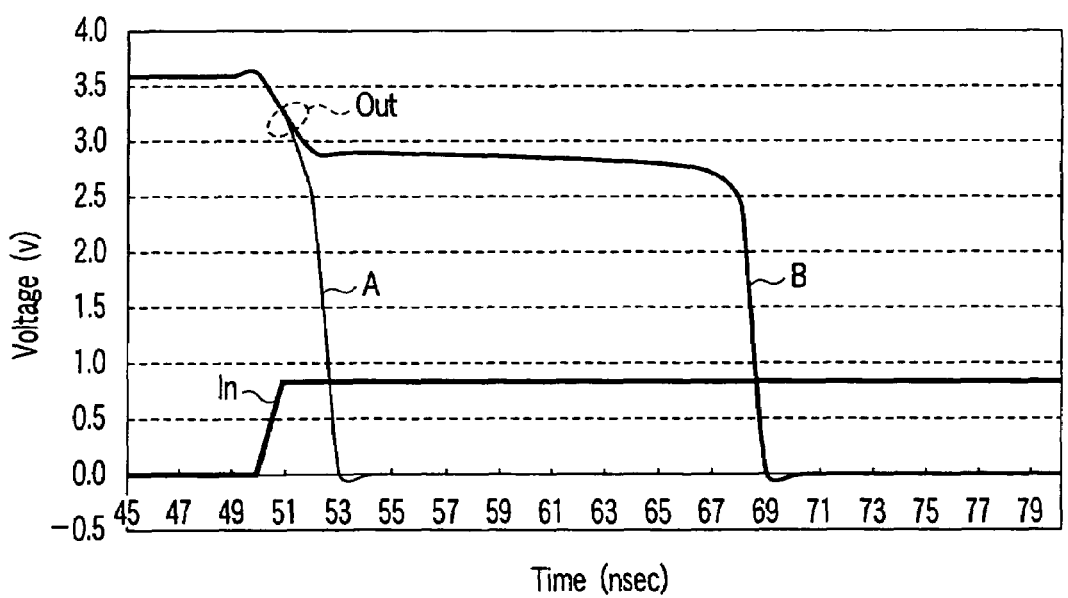
FIG. 2 is a characteristic view showing a comparison of the input and output characteristics of the circuit of the first embodiment and a conventional voltage level converter circuit.

FIG. 2 shows a comparison of the input and output characteristics of the voltage level converter circuit described in the first embodiment and in FIG. 2B of the publication above of the conventional example. In this case, the input signal In is the same and the output signal Out of the circuit of the first embodiment is shown by characteristic A, and the that of the conventional circuit is shown by characteristic B.

Assuming that the NMOS transistor 13 is turned on, the output node is discharged to the ground voltage, and the signal Out switches from the high level to the low level. At this time, in the case of the circuit of the first embodiment, the mutual conductance is small, and the output node is charged by an extremely small current from the PMOS transistor 19 which has a weak driving strength. Consequently, as shown by the characteristic A, the signal Out can be rapidly reduced from the VDD2 potential to the GND potential. That is, the transition time can be shortened when the output signal Out is changed from the high level to the low level.

However, when, in the case of the conventional circuit described in FIG. 2B of the conventional example publication, an NMOS transistor which discharges the output node is ON, the output node is charged using a large current from a PMOS transistor which has a strong driving force which is the same as that of the NMOS transistor. Accordingly, as shown in the characteristic B, an extremely long transition time is needed when the signal Out is reduced from the VDD2 potential to the GND potential.

Second Embodiment

Figure 3:
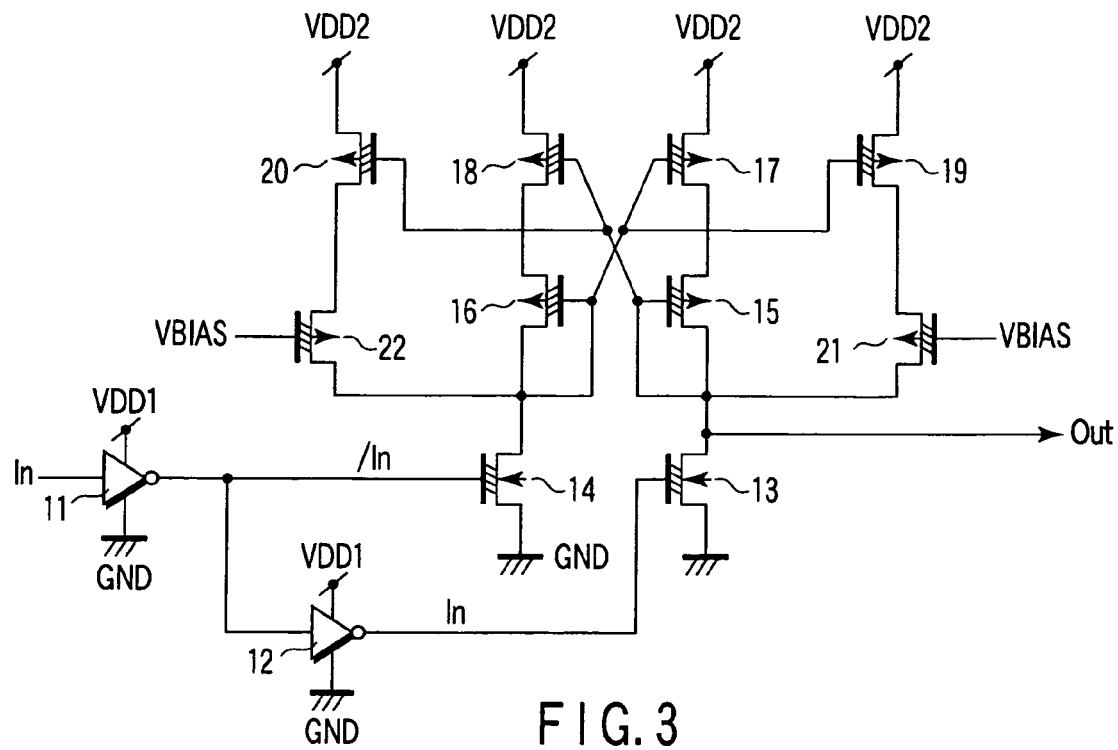
FIG. 3 is a circuit diagram of a voltage level converter circuit according to a second embodiment.

FIG. 3 shows a voltage level converter circuit according to a second embodiment. The voltage level converter circuit of the second embodiment has the same configuration as the circuit of the first embodiment shown in FIG. 1, except that in order to make current flowing to the PMOS transistors 19 and 20 even smaller, source and drain terminals of PMOS transistors 21 and 22 which are resistive elements for the PMOS transistors 19 and 20, are serially connected.

It is to be noted that in order to make an ON resistance value for the PMOS transistors 21 and 22 that have been newly added sufficiently high, a value of a bias voltage VBIAS of a direct current supplied to each of the gate terminals is a value obtained when an absolute value of a threshold voltage VthP of the PMOS transistors 21 and 22 is subtracted from the second power source voltage VDD2 or more, or in other words, the value of the bias voltage VBIAS is preferably (VDD2 to |VthP|) or more.

In the voltage level converter circuit of the second embodiment, as is the case in the circuit of the first embodiment, the effect of shortening the transition time when the output signal Out is changed from the high level to the low level can be achieved, and also level change is possible even if the amplitude of differential signals In, /In that are input become smaller. That is, even if the voltage for the differential signal is lowered, a wide range of operation can be ensured.

Third Embodiment

Figure 4:
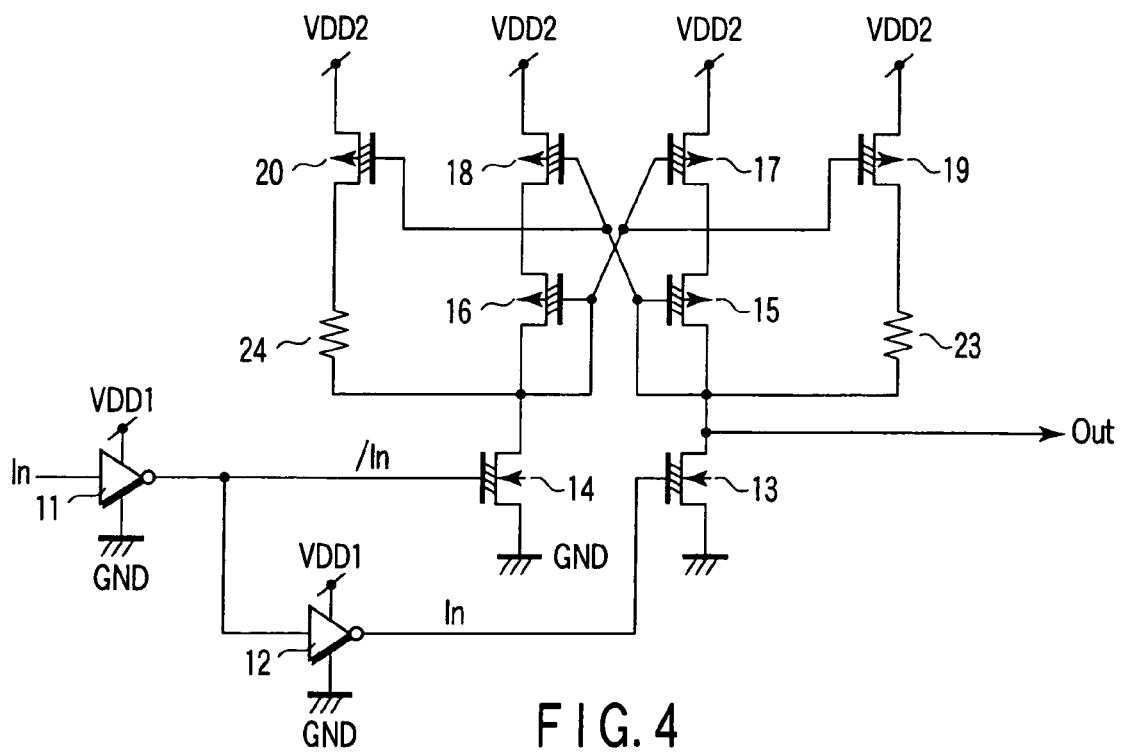
FIG. 4 is a circuit diagram of a voltage level converter circuit according to a third embodiment.

FIG. 4 shows a voltage level converter circuit according to a third embodiment. The voltage level converter circuit of the third embodiment has the same configuration as the circuit of the first embodiment shown in FIG. 1, except that in order to make current flowing to the PMOS transistors 19 and 20 even smaller, resistor elements 23 and 24 which are resistive elements for the PMOS transistors 19 and 20, are serially connected.

The same effects are obtained in the case of the voltage level converter circuit of the third embodiment and also in the case of the second embodiment.

Fourth Embodiment

Figure 5:
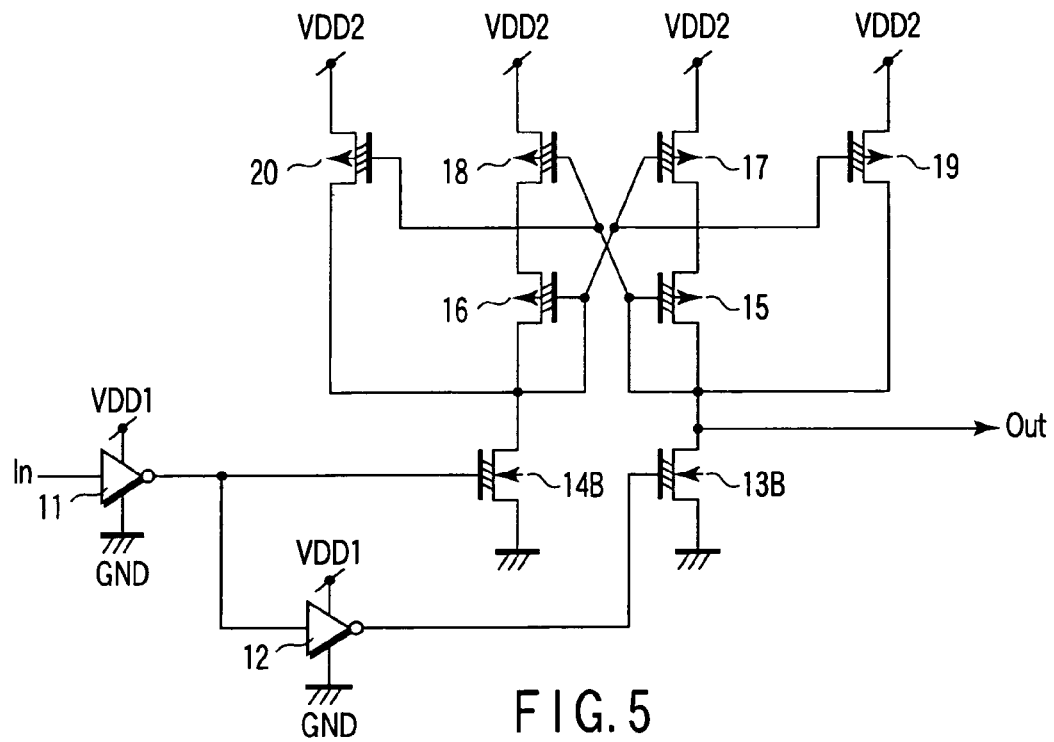
FIG. 5 is a circuit diagram of a voltage level converter circuit according to a fourth embodiment.

FIG. 5 shows a voltage level converter circuit according to a fourth embodiment. The voltage level converter circuit of the fourth embodiment has the same configuration as the circuit of the first embodiment shown in FIG. 1, except that in order to increase a driving force of the pair of NMOS transistors 13 and 14 which are supplied with differential signals, NMOS transistors 13B and 14B which have lower threshold values than the NMOS transistors 13 and 14 are used.

In the voltage level converter circuit of the fourth embodiment, the same effects in the first embodiment are obtained. In addition, even if the voltage for the differential signal is lowered, a wide range of operation can be ensured. It is to be noted that the threshold voltage for the MOS transistor is generally set by means such as controlling the amount of impurity ions introduced into a channel region, adjusting the thickness of a gate insulating film, and adjusting the size of a transistor element.

It is to be noted that the configuration may be such that the value of the current flowing to the PMOS transistors 19 and 20 can be made even smaller by adding the PMOS transistors 21 and 22 shown in FIG. 3 or the resistor elements 23 and 24 shown in FIG. 4 to the voltage level converter circuit of the fourth embodiment.

Fifth Embodiment

Figure 6:
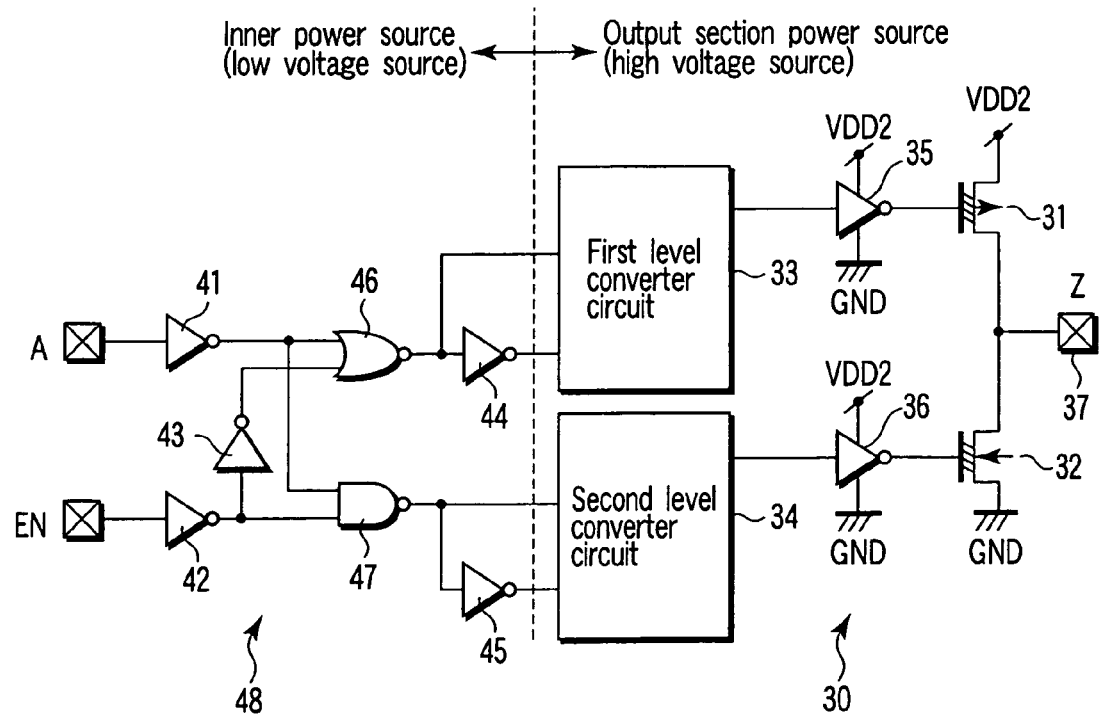
FIG. 6 is a circuit diagram of a voltage level converter circuit according to a fifth embodiment.

FIG. 6 shows a semiconductor integrated circuit according to a fifth embodiment in which the voltage level converter circuit according to each of the first, second, third and fourth embodiments described above is included in an output section.

The output section 30 includes: a first output transistor 31 of a PMOS transistor; a second output transistor 32 of an NMOS transistor; a first voltage level converter circuit 33 into which a first differential signal which performs level conversion is input; a second voltage level converter circuit 34 into which a second differential signal which performs level conversion is input; an inverter circuit 35 which inverts an output signal of the first voltage level converter circuit 33 and supplies it to a gate terminal of the first output transistor 31; and an inverter circuit 36 which inverts an output signal of the second voltage level converter circuit 34 and supplies it to a gate terminal of the second output transistor 32.

One of source and drain terminals of the first output transistor 31 is connected to a supply terminal having a power source voltage (VDD2), and the other of the source and drain terminals is connected to an external output terminal 37. An output terminal of the inverter circuit 35 is connected to the gate terminal of the first output transistor 31. One of source and drain terminals of the second output transistor 32 is connected to a ground voltage (GND) supply terminal, and the other of the source and drain terminals is connected to the external output terminal 37. An output terminal of the inverter circuit 36 is connected to the gate terminal of the second output transistor 32. It is to be noted that both the inverter circuits 35 and 36 operate at the power source voltage VDD2.

The first and second voltage level converter circuits 33 and 34 have a configuration excluding the first and second inverter circuits 11 and 12 from the voltage level converter circuit according to any one of the first, second, third, and fourth embodiments described above. The first and second voltage level converter circuits 33 and 34 also operate at the power source voltage VDD2.

A control circuit 48 includes inverter circuits 41, 42, 43, 44 and 45, an NOR gate circuit 46 and an NAND gate 47. The control circuit 48 generates first and second differential signals to be supplied to the first and second voltage level converter circuits 33 and 34 in accordance with an input signal A and an enable signal EN. Gate circuits in the control circuit 48 each operate at a power source voltage VDD1 (VDD1<VDD2).

The semiconductor integration circuit device shown in FIG. 6 configures an output buffer for converting the level of the input signal A and outputting it.

When the enable signal EN is at a high level (VDD1), an output signal from the NOR gate circuit 46 is switched to a low level (GND) and an output signal of the NAND gate circuit 47 is switched to the high level (VDD1) regardless of the level of the input signal A. In addition, the signals, which correspond to the above-described differential signals /In, In and are supplied to the first voltage level converter circuit 33, become the low level and high level, and the signals, which correspond to the above-described differential signals /In, In and are supplied to the second voltage level converter circuit 34, become the high level and low level.

At this time, the output signals from the first voltage level converter circuit 33 become the low level (GND), and the output signals from the second voltage level converter circuit 34 become the high level (VDD2). As previously described, the high level signal for the output signals of the first and second voltage level converter circuits change levels from the VDD1 potential to the VDD2 potential. Furthermore, the output signal from the inverter circuit 35 switches to the high voltage (VDD2) while the output signal of the inverter 36 switches to the low voltage (GND), and the first and second output transistors 31 and 32 are both switched to the OFF state. That is, in this case, the external output terminal 37 is in a high impedance state.

When the enable signal EN is at a low level (GND), the output signals from the NOR gate circuit 46 and the NAND gate circuit 47 switch to a level that corresponds to the input signal A, and the first and second differential signals corresponding to the level of the input signal A are supplied to the first and second voltage level converter circuits 33 and 34. For example, when the input signal A is at the low level (GND), the output signals from the NOR gate circuit 46 and the NAND gate circuit 47 both switch to the low level (GND), and the output signals from the first and second voltage level converter circuits 33 and 34 both switch to the low level (GND). At this time, the first output transistor 31 is in the OFF state and the second output transistor 32 is in the ON state. That is, in this case, a signal Z from the external output terminal 37 has a low potential (GND).

On the other hand, when the enable signal EN is the low level (GND) and the input signal A is the high level (VDD1), the output signals of the NOR gate circuit 46 and the AND gate circuit 47 both become the high level (VDD1), and the output signals from the first and second voltage level converter circuits 33 and 34 both switch to the high level (VDD2). At this time, the first output transistor 31 is in the ON state and the second output transistor 32 is in the OFF state. That is, in this case, the signal Z from the external output terminal 37 has a high potential (VDD2).

In the semiconductor integrated circuit device, the transition time can be shortened when the output signals from the first and second voltage level converter circuits 33 and 34 transit from high potential to low potential, and thus, the delay time between input and output signals from the output buffer is shortened.

Figure 7:
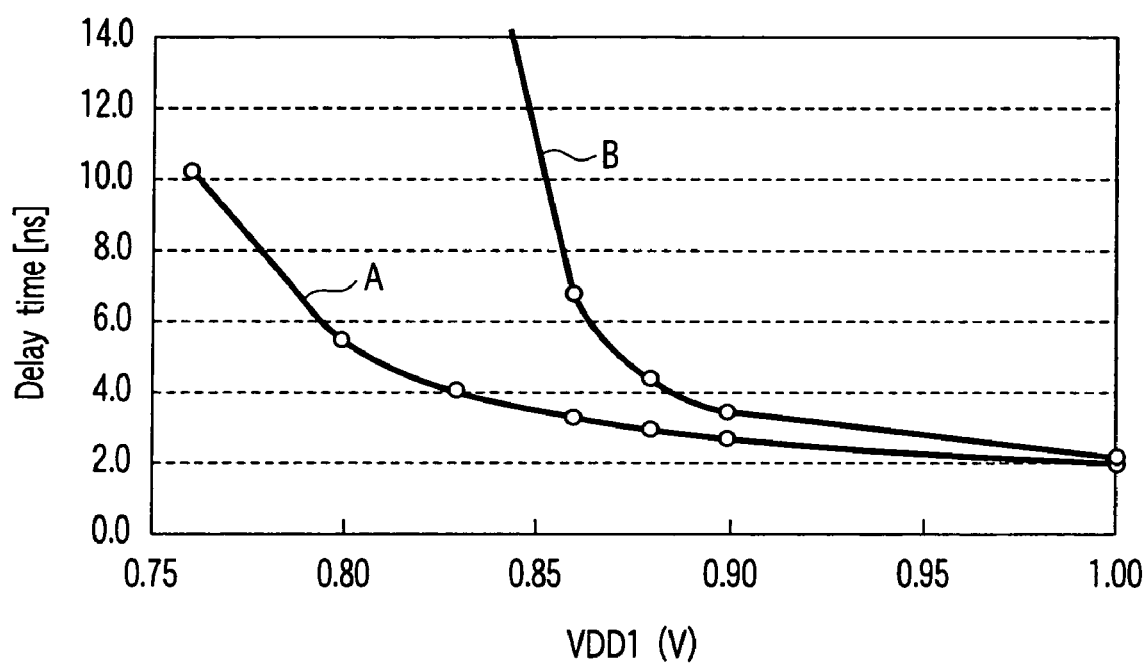
FIG. 7 is a characteristic view showing a comparison of the input and output characteristics of the circuit of the embodiment shown in FIG. 6 and an output buffer using the conventional voltage level converter circuit.

FIG. 7 shows a comparison of the input and output characteristics of the output buffer using the voltage level converter circuit of the embodiment shown in FIG. 6 and the output buffer using the voltage level converter circuit shown in FIG. 2B of the conventional example publication described above. It is to be noted that the horizontal axis shows a power source voltage VDD1 (V) while the vertical axis shows a delay time (nS) of the output buffer. Delay time is shown by characteristic A in the circuit of the above embodiment and is shown by characteristic B in the conventional circuit.

As is apparent in FIG. 7, even in the case where the value of the power source voltage VDD1 (V) is 0.9V, the delay time is reduced when compared with the conventional case. However, when the value of the power source voltage VDD1 (V) is reduced, the effect of reduction in delay time becomes more remarkable.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A voltage level converter circuit comprising:
a first transistor of a first polarity which has source and drain terminals and a gate terminal, one of the source and drain terminals being connected to a supply terminal having a first power source voltage, the other of the source and drain terminals being connected to a signal output node, and the gate terminal being supplied with one input signal of differential signals which perform level conversion;
a second transistor of the first polarity which has source and drain terminals and a gate terminal, one of the source and drain terminals being connected to the supply terminal having the first power source voltage, and the gate terminal being supplied with the other input signal of the differential signals which perform level conversion;
a third transistor of a second polarity which has source and drain terminals and a gate terminal, one of the source and drain terminals and the gate terminal being connected to the signal output node;
a fourth transistor of the second polarity which has source and drain terminals and a gate terminal, one of the source and drain terminals and the gate terminal being connected to the other of the source and drain terminals of the second transistor;
a fifth transistor of the second polarity which has source and drain terminals and a gate terminal, one of the source and drain terminals being connected to a supply terminal having a second power source voltage, the other of the source and drain terminals being connected to the other of the source and drain terminals of the third transistor, and the gate terminal being connected to the gate terminal of the fourth transistor;
a sixth transistor of the second polarity which has source and drain terminals and a gate terminal, one of the source and drain terminals being connected to the supply terminal having the second power source voltage, the other of the source and drain terminals being connected to the other of the source and drain terminals of the fourth transistor, and the gate terminal being connected to the gate terminal of the third transistor;

a seventh transistor of the second polarity which has source and drain terminals and a gate terminal, one of the source and drain terminals being connected to the supply terminal having the second power source voltage, the other of the source and drain terminals being bonded to the signal output node, and the gate terminal being connected to the gate terminal of the fifth transistor;

an eighth transistor of the second polarity which has source and drain terminals and a gate terminal, one of the source and drain terminals being connected to the supply terminal having the second power source voltage, the other of the source and drain terminals being bonded with the other of the source and drain terminals of the second transistor, and the gate terminal being connected to the gate terminal of the sixth transistor.

2. The voltage level converter circuit according to claim 1, wherein a potential difference of the amplitude of one differential signal and that of the other signal is smaller than a potential difference between the first and second power sources.

3. The voltage level converter circuit according to claim 1, further comprising:
a first resistive element which is connected between the other of the source and drain terminals of the seventh transistor and the signal output node; and
a second resistive element which is connected between the other of the source and drain terminals of the eighth transistor and the other of the source and drain terminals of the second transistor.

4. The voltage level converter circuit according to claim 3, wherein the first and second resistive elements are configured by ninth and tenth transistors of the second polarity, each of the ninth and tenth transistors has source and drain terminals and a gate terminal, and the gate terminal being supplied with a direct current bias voltage.

5. The voltage level converter circuit according to claim 3, wherein the first and second resistive elements are configured by a resistor element.

6. The voltage level converter circuit according to claim 1, wherein the mutual conductance of each of the seventh and eight transistors is smaller than the mutual conductance of each of the first and second transistors.

7. The voltage level converter circuit according to claim 1, wherein the first polarity is an N-channel and second polarity is a P-channel.

8. A semiconductor integrated circuit device comprising:
a first output transistor of a first polarity which has source and drain terminals and a gate terminal, one of the source and drain terminals being connected to a supply terminal having a first power source voltage, and the other of the source and drain terminals being connected to a signal output terminal;
a second output transistor of a second polarity which has source and drain terminals and a gate terminal, one of the source and drain terminals being connected to a supply terminal having a second power source voltage, and the other of the source and drain terminals being connected to the signal output terminal;
a first voltage level converter circuit which has a first output signal node, and which is supplied with first differential signals for performing level conversion, the first voltage level converter circuit outputting a first signal having a larger amplitude than that of the first differential signals to the first signal output node;
a second voltage level converter circuit which has a second output signal node, and which is supplied with second differential signals for performing level conversion, the second voltage level converter circuit outputting a second signal having a larger amplitude than that of the second differential signals to the second signal output node;
a first inverter circuit which receives signal from the first signal output node, and outputs a signal to the gate terminal of the first output transistor; and
a second inverter circuit which receives signal from the second signal output node, and outputs a signal to the gate terminal of the second output transistor, wherein
the first and second voltage level converter circuits each comprise:
a first transistor of the second polarity which has source and drain terminals and a gate terminal, one of the source and drain terminals being connected to the supply terminal having the second power source voltage, the other of the source and drain terminals being connected to the first or second signal output node, and the gate terminal being supplied with one input signal of the first or second differential signals which perform level conversion;
a second transistor of the second polarity which has source and drain terminals and a gate terminal, one of the source and drain terminals being connected to the supply terminal having the second power source voltage, and the gate terminal being supplied with the other input signal of the first or second differential signals which perform level conversion;
a third transistor of the first polarity which has source and drain terminals and a gate terminal, one of the source and drain terminals and the gate terminal being connected to the first or second signal output node;
a fourth transistor of the first polarity which has source and drain terminals and a gate terminal, one of the source and drain terminals and the gate terminal being connected to the other of the source and drain terminals of the second transistor;
a fifth transistor of the first polarity which has source and drain terminals and a gate terminal, one of the source and drain terminals being connected to the supply terminal having the first power source voltage, the other of the source and drain terminals being connected to the other of the source and drain terminals of the third transistor, and the gate terminal being connected to the gate terminal of the fourth transistor;
a sixth transistor of the first polarity which has source and drain terminals and a gate terminal, one of the source and drain terminals being connected to the supply terminal having the first power source voltage, the other of the source and drain terminals being connected to the other of the source and drain terminals of the fourth transistor, and the gate terminal being connected to the gate terminal of the third transistor;
a seventh transistor of the first polarity which has source and drain terminals and a gate terminal, one of the source and drain terminals being connected to the supply terminal having the first power source voltage, the other of the source and drain terminals being bonded to the first or second signal output node, and the gate terminal being connected to the gate terminal of the fifth transistor;

an eighth transistor of the first polarity which has source and drain terminals and a gate terminal, one of the source and drain terminals being connected to the supply terminal having the first power source voltage, the other of the source and drain terminals being bonded with the other of the source and drain terminals of the second transistor, and the gate terminal being connected to the gate terminal of the sixth transistor.

9. The semiconductor integrated circuit device according to claim 8, further comprising:

a first resistive element which is connected between the other of the source and drain terminals of the seventh transistor and the signal output node; and a second resistive element which is connected between the other of the source and drain terminals of the eighth transistor and the other of the source and drain terminals of the second transistor.

10. The semiconductor integrated circuit device according to claim 9, wherein the first and second resistive elements are configured by ninth and tenth transistors of the second polarity, each of the ninth and tenth transistors has source and drain terminals and a gate terminal, and the gate terminal being supplied with a direct current bias voltage.

11. The semiconductor integrated circuit device according to claim 9, wherein the first and second resistive elements each are configured by a resistor element.

12. The semiconductor integrated circuit device according to claim 8, wherein the mutual conductance of each of the seventh and eight transistors is smaller than the mutual conductance of each of the first and second transistors.

13. The semiconductor integrated circuit device according to claim 8, wherein the first polarity is a P-channel and the second polarity is an N-channel.

* * * * *